(12) United States Patent
Eriksson

(10) Patent No.: US 9,257,944 B2
(45) Date of Patent: Feb. 9, 2016

(54) METHOD AND ARRANGEMENT FOR DRIVING A MICROPHONE

(75) Inventor: Sven-Åke Eriksson, Siljansnäs (SE)

(73) Assignee: Research Electronics Leksand AB, Siljansnas (SE)

( * ) Notice: Subject to any disclaimer, the term of this patent is extended or adjusted under 35 U.S.C. 154(b) by 744 days.

(21) Appl. No.: 13/577,105

(22) PCT Filed: Sep. 13, 2010

(86) PCT No.: PCT/SE2010/050974
§ 371 (c)(1),
(2), (4) Date: Aug. 3, 2012

(87) PCT Pub. No.: WO2011/096868
PCT Pub. Date: Aug. 11, 2011

(65) Prior Publication Data
US 2012/0308051 A1    Dec. 6, 2012

(30) Foreign Application Priority Data
Feb. 5, 2010 (SE) ........................ 1050120

(51) Int. Cl.
*H03F 99/00* (2009.01)
*H03F 3/183* (2006.01)
*H03F 3/45* (2006.01)

(52) U.S. Cl.
CPC ............ *H03F 3/183* (2013.01); *H03F 3/45076* (2013.01); *H03F 2200/534* (2013.01); *H03F 2203/45228* (2013.01)

(58) Field of Classification Search
CPC ................. H03F 3/183; H03F 3/45076; H03F 2203/45228; H03F 2200/534

USPC ........................................................ 381/120
See application file for complete search history.

(56) References Cited

U.S. PATENT DOCUMENTS

| | | |
|---|---|---|
| 4,374,363 A | 2/1983 | Previti |
| 4,688,000 A | 8/1987 | Donovan |
| 7,072,478 B2 | 7/2006 | Hohendahl |

(Continued)

FOREIGN PATENT DOCUMENTS

| | | |
|---|---|---|
| CA | 2788409 A1 | 8/2011 |
| CN | 1868114 | 11/2006 |
| KR | 1007332880000 | 6/2007 |
| WO | 0022726 A1 | 4/2000 |

OTHER PUBLICATIONS

Silva-Martinez et al. "Low Frequency Amplifiers for Electret Microphones" Circuits and System, Proceedings of the 38th Mid West Symposium on Rio De Janerio, Brazil, Aug. 13-16, 1995; pp. 1018-1021.*

(Continued)

*Primary Examiner* — Paul S Kim
(74) *Attorney, Agent, or Firm* — Browdy and Neimark, PLLC

(57) ABSTRACT

Disclosed is a differential microphone pre-amplifier circuit (120) for providing an amplified differential signal at a first (A) and a second (B) output terminal of the microphone pre-amplifier (120), including a first voltage controlled current generator (101), a second voltage controlled current generator (102) and a third voltage controlled current generator (103) all being configured to receive, amplify and convert a voltage signal generated by an associated microphone (110) to a current signal output.

5 Claims, 3 Drawing Sheets

(56) References Cited

U.S. PATENT DOCUMENTS 7,259,627 B1 8/2007 Dhanasekaran et al.
2005/0076466 A1 4/2005 Yan

OTHER PUBLICATIONS

Gil-Seop Park et al "A CMOS Linear Preamplifier Design for Electret Microphones" International Soc Design Conference, 11-17: XP031449542: ISBN: 978-1-4244-2598-3 (2008).

Jose Silva-Martinez et al "Low Frequency Amplifiers for Electret Microphones" Circuits and System. Proceedings of the 38th Mid West Symposium on Rio De Janerio, Brazil Aug. 13-16, 1995. 2:1018-1021 :XP010165301: ISBM: 987-0-7803-2972-0 (1995).
European search report. Application No. 10845362.2-1810/2532090 PCT/SE2010050974. Dated Sep. 11, 2014.
Park, et al., A CMOS Linear Preamplifier Design for Electret Microphones, International SoC Design Conference, 2008, pp. II-17-II-19.
Canadian Intellectual Property Office, Office Action, Jan. 31, 2014.

* cited by examiner

METHOD AND ARRANGEMENT FOR DRIVING A MICROPHONE

TECHNICAL FIELD

The present invention relates to pre-amplifiers. In particular, it relates to high-impedance output pre-amplifier circuits for microphones.

BACKGROUND

In the early history of microphones there were only vacuum tube based amplifiers accessible. The high output impedance of the vacuum tubes, together with the high voltage of some 100 Volts DC needed to drive the vacuum tubes, forced engineers to use a transformer based coupling to drive the low-impedance input of a typical mixer table.

Conventionally, microphone assemblies include a microphone element and a pre-amplifier circuit in a fixed configuration within a common housing. The microphone assembly typically also includes an output terminal in which the signal generated by the microphone element and amplified by the microphone pre-amplifier circuit is output. The power needed to drive the vacuum tube microphone pre-amplifier circuits were so high, that a separate power unit had to be used to drive the vacuum tube microphone pre-amplifier circuit. The vacuum tube microphone pre-amplifier circuit is normally built-in the microphone housing. In order to send a rather noise sensitive signal generated by the microphone, over lengthy wires, is used a common transfer technique. This known transfer technique uses two signal wires and a common ground wire. The two signal wires contain, in principle, the same signal, at least amplitude wise. The first signal wire contains a signal which is phase shifted by 180 degrees and the second signal wire contains an un-shifted signal, both signals having the same amplitude. Hence the difference of the both signals may be calculated as S−(−S)=2S. Any noise entered via the wires will remain 'un-shifted' and theoretically the noise will, in the subtraction stage, disappear. This is proven by the calculation of N−N=0.

Next step in the evolution was the introduction of the transistor. A transistor based microphone pre-amplifier consumes a very small amount of power compared to a vacuum-tube based microphone pre-amplifier, thus eliminating the need for a separate power supply to the combined microphone pre-amplifier circuit and microphone device. The transistor microphone pre-amplifier circuit in known microphone assemblies is arranged such that the microphone pre-amplifier has two outputs ('hot' and 'cold'). A first output is driven with a 180 degree phase shift compared to a second output. Thereby emulating the 'old' signal properties and enabling the already known solution on signal to noise reduction by utilization of differential phase-shifted signals. Modern high-end microphones still today sometimes utilize a transformer, having a common mid-point outlet used as signal ground, to drive the 'hot' and 'cold' output. The transformer is a heavy and expensive component, thus a 'transformer-less technology', built on transistor technology was introduced some decades ago.

An input stage of known microphone pre-amplifier circuits, based on transistor technology, normally has high input impedance in order to prevent signal reduction. The pre-amplified signal from the microphone pre-amplifier circuit is normally output to an audio amplifier, or a mixer table, which provides the major signal gain and mixing possibilities. Prior art microphone pre-amplifier circuits for capacitive transducers are low output impedance voltage output devices and a problem with these prior art microphone pre-amplifier circuits is the need for expensive tuning of circuits, i.e., a circuit may have to be laser tuned in order to meet the demands of precision. Thus the 'transformer-less technology' has a disadvantage, namely the transistor microphone pre-amplifier circuit has to be configured such that it has a very exact precision in both amplitude and phase shift. This precision, as indicated by audio expertise, has to be better than ±1%. This may off course be achieved by present circuits, but requires serious and very expensive laser tuning of circuits.

A further problem with existing solutions is the lack of possibility to 'squeeze' out as much amplification as one would want to. Should the known microphone pre-amplifier circuits be set to maximum amplification it would be at the risk of instability in the feed-back loop. The feed-back loop includes input of the so called 'phantom' power supply and microphone pre-amplifier low impedance output. The 'phantom' power supply is when there is no need for a separate power supply to the microphone pre-amplifier circuit and the microphone. Yet a further problem of known solutions is the need for an output coupling capacitor of the microphone pre-amplifier circuit. Without the output coupling capacitor a current rush would be the inevitable result of connecting a DC power supply to the microphone pre-amplifier circuit. This can be concluded since known microphone pre-amplifier circuits are low output impedance circuits. As a result this would lead to an output circuit of the microphone pre-amplifier circuit that, due to its low output impedance and the fact that its working-point normally is around the middle of the supplied voltage (typically 48 VDC), would suffer from a current rush caused by half the supply voltage. The supply voltage has to be at this level in order to make the microphone pre-amplifier circuit to work properly. As stated above, half of the supplied DC voltage would cause a large current to rush through the, rather low, output impedance causing severe damage to the microphone pre-amplifier circuit. Yet another problem with known solution is the size of the microphone pre-amplifier circuit. In a combined microphone and microphone pre-amplifier assembly it is vital to keep the size down at a minimum in order to fit both microphone element and pre-amplifier circuit in a common housing. As can be concluded by the discussion above, there is a need for improved microphone pre-amplifier circuit.

SUMMARY

An object of the invention is to alleviate at least some of the problems mentioned above. A further object according to exemplary embodiments of present invention is to provide a microphone pre-amplifier for providing an amplified differential signal at a first and a second output terminal of the microphone pre-amplifier, including; a first voltage controlled current generator, configured to receive, amplify and convert a voltage signal generated by an associated microphone to a current signal output. Wherein the first voltage controlled current generator comprises a first high impedance input circuit operatively coupled to; a first output circuit operatively coupled to a second high impedance input circuit of a second voltage controlled current generator, further operatively coupled to a first output terminal; and a second output circuit, operatively coupled to a third high impedance input circuit of a third voltage controlled current generator, further operatively coupled to a second output terminal. Wherein the third voltage controlled current generator is configured to provide an amplified and converted differential current signal at the first output terminal, and the second voltage controlled current generator being configured to provide an amplified and converted differential current signal at the second output terminal.

An advantage of embodiments of the invention is that exit coupling capacitors are not needed at the microphone pre-amplifier circuit output. A further advantage of embodiments of the invention is the elimination of over load during connection (on-switching) of the microphone pre-amplifier circuit. Furthermore, the risk of instability effects, which traditionally may occur at high loads of low impedance character, is eliminated. Also a further advantage is that the microphone pre-amplifier circuit is small and easy to build. Voltage controlled current generators of adequate precision are easy to fabricate with available standard components without the need of a following tuning of circuits. Thus it is easy to build a small, robust microphone pre-amplifier circuit by utilizing the below described embodiments of present invention.

BRIEF DESCRIPTION OF THE DRAWINGS

In the following description of embodiments of the invention, reference will be made to the accompanying drawings of which.

DETAILED DESCRIPTION

Figure 1:
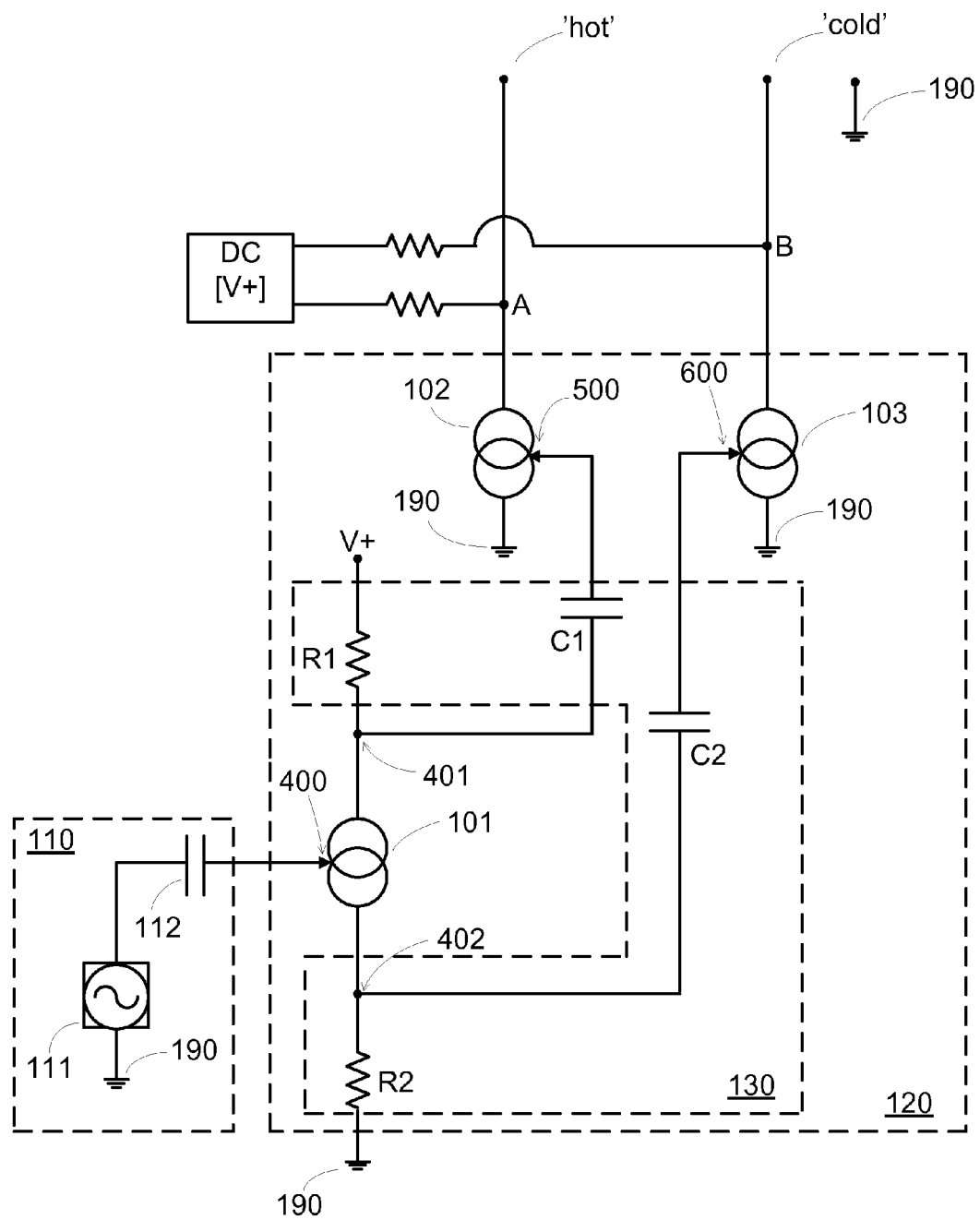
FIG. 1 is a diagram illustrating an exemplary embodiment of present invention, showing a microphone pre-amplifier circuit having voltage controlled current generators as signal drivers.

FIG. 1 illustrates a differential microphone pre-amplifier 120, implemented according to an exemplary embodiment of present invention, and coupled to a microphone (MIC) 110. The differential microphone pre-amplifier 120 and the microphone (MIC) 110 are in one embodiment of the invention mounted in the same housing, not illustrated in the drawings. Microphone 110 may furthermore have additional signal amplification circuits which are not shown here for clarity of description. In operation, by virtue of its structure, the signal voltage is generated by a microphone element 111 of the microphone 110 and is fed to an input 400 of the microphone pre-amplifier circuit 120, via an input coupling capacitor 112. I.e. the signal voltage is created as difference in potential between a signal ground potential 190 and a voltage potential created by the microphone element 111. The microphone pre-amplifying circuit 120 will now be described in more detail below, and the signal current generated by the pre-amplifier circuit 120 is fed as an anti-symmetrical current signal. I.e. the current signal magnitude flowing out of node A is approximately (preferably exactly) equal to the magnitude of the current signal magnitude flowing out of node B. However, the current flowing out of node A is 180 degrees out of phase relative to the current flowing out of node B. A supply voltage V+ is provided to inputs of voltage controlled current generator 102 and voltage controlled current generator 103, generating a bias current $I_1$ and $I_2$, respectively. The supply voltage V+ is also provided to a voltage controlled current generator 101, generating a bias current $I_o$ flowing through 101. The voltage signal from the microphone 110 is fed to the voltage controlled current generator 101 traversed by a bias DC-current $I_0$ that may be modulated both up- and down by incoming voltage signal from the microphone 110. The modulation must be done such that there always flow a bias current, $I_0$, however small it might be. The function of the bias current is to not drive the current flowing through the voltage controlled current generator 101 to zero. The presence of the bias current $I_0$ is to prevent the signal to 'clip'.

Thus the bias current $I_0$ flow through resistor R1 and R2 enabling a first output 401 and a second output 402 of the voltage controlled current generator 101 to be modulated up or down, depending on the input. The voltage signal at output 401 and 402 respectively is led via a phase-shifting circuit 130, coupled between the supply voltage V+ and ground 190 via resistors R1 and R2. The voltage signal taken out at output 402 over resistor R2 will be in phase with the input signal and at the same time the voltage signal taken out at output 401 over resistor R1 will be exactly 180 degrees phase shifted compared to the input voltage signal. The amplitude accuracy of the phase shifting circuit 130 will be determined by the accuracy of the resistors R1 and R2.

After the phase shifting circuit 130 the output voltage signal will be fed to two exit circuits, via capacitors C1 and C2. The voltage from output 401 of the first voltage controlled current generator 101 is fed via capacitor C1 to an input 500 of the second voltage controlled current generator 102. The voltage from output 402 of the second voltage controlled current generator 102 is fed via capacitor C2 to an input 600 of the third voltage controlled current generator 102.

Thus the exit circuits 102, 103 are i.e. two separate and independent voltage controlled current generators 102 and 103 respectively. The output current 'hot' from the voltage controlled current generator 102 respective the output 'cold' from the voltage controlled current generator 103 will be in 180 degrees phase shift resp. zero phase shift. The high output impedance of the voltage controlled current generators 102, 103 will automatically adjust the voltage on A and B respectively to what is available (nominal voltage, typically but not restricted to 48 VDC) independent of the momentary value of the output signal current.

By utilizing voltage controlled current generators 102, 103 and transforming the voltage signal to an output current signal, the circuit above is always DC-coupled to A and B compared to a voltage output stage that has to have blocking capacitors in order to not 'burn up'. 1. In brief is provided in an exemplary embodiment a differential microphone pre-amplifier circuit 120 providing an amplified differential signal at a first A and a second B output terminal of the microphone pre-amplifier including a first voltage controlled current generator 101, configured to receive, amplify and convert a voltage signal generated by an associated microphone 110 to a current signal, the first voltage controlled current generator 101 having a first high impedance input circuit 400 operatively coupled to a first output circuit 401 and operatively coupled to a second output circuit 402, said first output circuit 401 and second output circuit 402 are coupled via a phase shifting circuit 130, configured to create a differential current signal by phase shifting the received voltage signal by either 0 or 180 degrees, to a second high impedance input circuit 500 of a second voltage controlled current generator 102, operatively coupled to a first output terminal A, and a third high impedance input circuit 600 of a third voltage controlled current generator 103, operatively coupled to a second output terminal B. Wherein the third voltage controlled current generator 103 is configured to provide the amplified and converted differential current signal, having an un-shifted phase at the first output terminal B, and the second voltage controlled current generator 102 being configured to provide the amplified and converted differential current signal having a 180 degrees phase shift at the second output terminal A.

Figure 2:
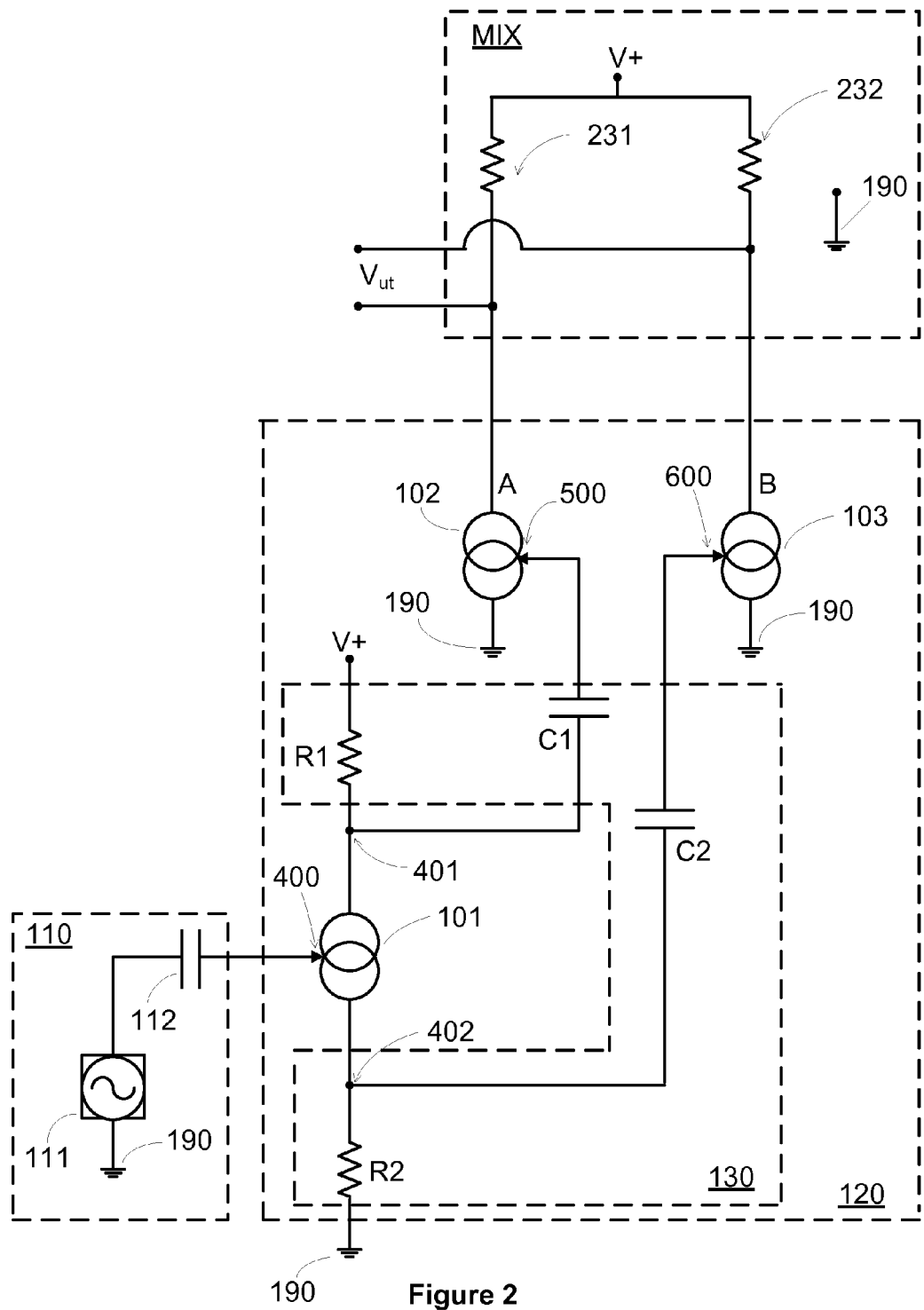
FIG. 2 is a diagram illustrating the microphone pre-amplifier circuit having voltage controlled current generators as signal drivers, when the load is purely resistive.

FIG. 2 illustrates the microphone pre-amplifier circuit 120 used for driving a resistive load 231, 232 by the current outputs of the voltage controlled current generators 102 and 103 respectively. In the resistive case illustrated, the output current signal is transformed to an output voltage signal Vut by applying Ohms law U=R*I over resistor 231 and 232.

Figure 3:
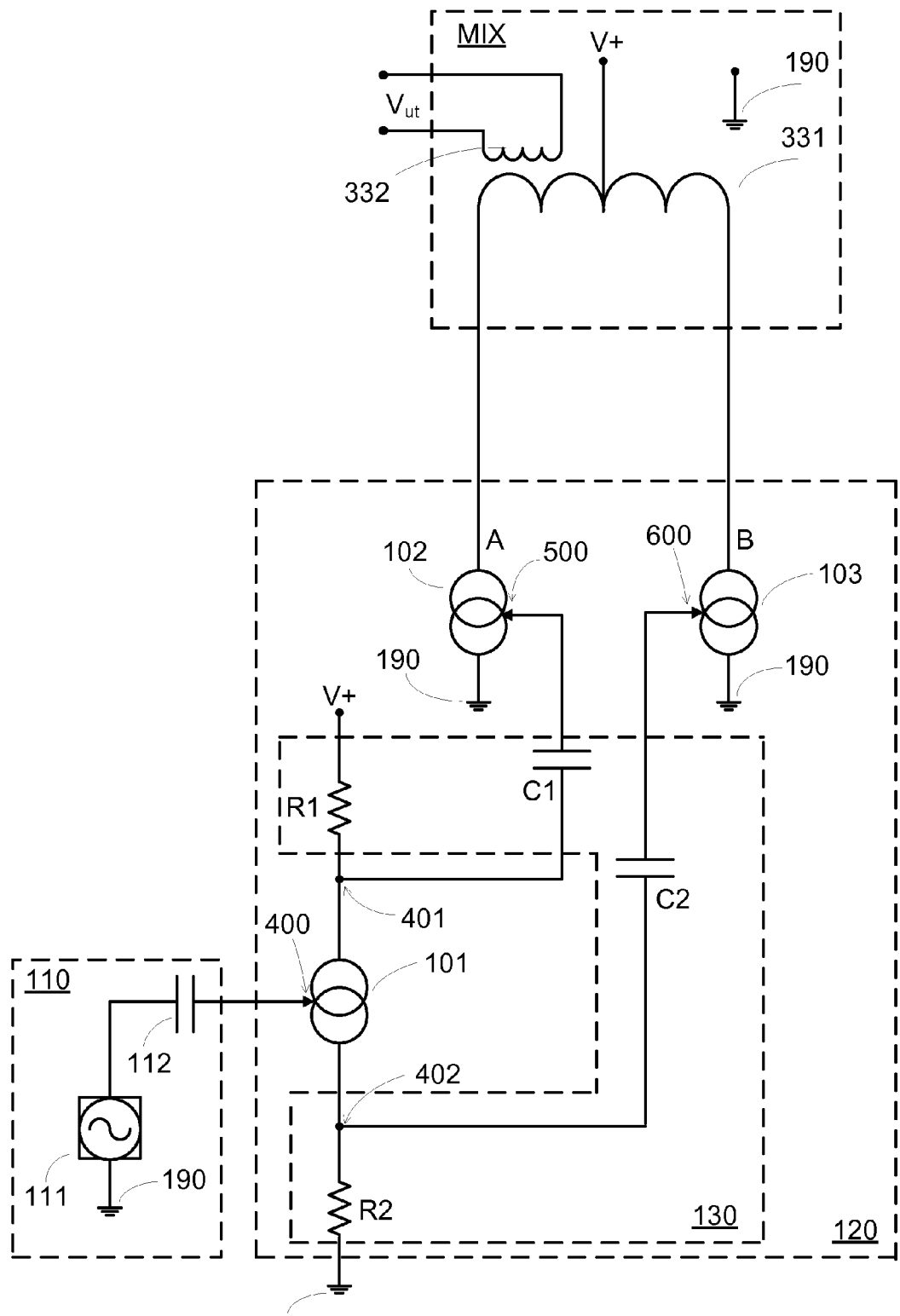
FIG. 3 is a diagram illustrating the microphone pre-amplifier circuit having voltage controlled current generators as signal drivers, when the load is inductive.

FIG. 3 illustrates the microphone pre-amplifier circuit 120 used for driving an inductive load 331 by the current outputs of the voltage controlled current generators 102 and 103 respectively. In the inductive case, i.e. when coupled to a transformer 331, 332, it is recognized that the current driven in the primary winding 331 is retrieved at the output 332 multiplied with the transformation ratio. The output voltage signal Vut will be transformed either by a current driven active circuit or by leading the current in winding 332 through a resistor (not illustrated) and retrieve the voltage signal over the resistor.

Throughout this disclosure, the word "comprise" or "comprising" has been used in a non-limiting sense, i.e. meaning "consist at least of". Although specific terms may be employed herein, they are used in a generic and descriptive sense only and not for purposes of limitation.

The invention claimed is:

1. A differential microphone pre-amplifier circuit (120) providing an amplified differential signal at a first (A) and a second (B) output terminal of the microphone pre-amplifier, comprising:
a first voltage controlled current generator (101), configured to receive, amplify and convert a voltage signal generated by an associated microphone (110) to a current signal output, wherein the first voltage controlled current generator (101) comprise a first high impedance input circuit (400) operatively coupled to
a first output circuit (401); operatively coupled to a second high impedance input circuit (500) of a second voltage controlled current generator (102), further operatively coupled to a first output terminal (A); and
a second output circuit (402), operatively coupled to a third high impedance input circuit (600) of a third voltage controlled current generator (103), further operatively coupled to a second output terminal (B);
wherein the third voltage controlled current generator (103) is configured to provide an amplified and converted differential current signal at the first output terminal (B), and the second voltage controlled current generator (102) being configured to provide an amplified and converted differential current signal at the second output terminal (A);
the differential microphone pre-amplifier circuit further comprising
a phase shifting circuit (130), configured to create a differential current signal by phase shifting the received voltage signal by either 0 or 180 degrees, the phase shifting circuit (130) coupled between the output circuits (401, 402) of the first voltage controlled current generator (101) and the input circuit (500) of the second voltage controlled current generator (102) configured to provide an amplified and converted differential current signal having a 180 degrees phase shift at the second output terminal (A); and the input circuit (600) of the third voltage controlled current generator (103) configured to provide an amplified and converted differential current signal, having an un-shifted phase at the first output terminal (B).

2. A differential microphone pre-amplifier circuit (120) providing an amplified differential signal at a first (A) and a second (B) output terminal of the microphone pre-amplifier, comprising:
a first voltage controlled current generator (101), configured to receive, amplify and convert a voltage signal generated by an associated microphone (110) to a current signal output, wherein the first voltage controlled current generator (101) comprise a first high impedance input circuit (400) operatively coupled to
a first output circuit (401); operatively coupled to a second high impedance input circuit (500) of a second voltage controlled current generator (102), further operatively coupled to a first output terminal (A); and
a second output circuit (402), operatively coupled to a third high impedance input circuit (600) of a third voltage controlled current generator (103), further operatively coupled to a second output terminal (B);
wherein the third voltage controlled current generator (103) is configured to provide an amplified and converted differential current signal at the first output terminal (B), and the second voltage controlled current generator (102) being configured to provide an amplified and converted differential current signal at the second output terminal (A);
wherein the phase shifting circuit (130) comprises:
a first resistor (R1), coupled at one end to the first output circuit (401) of the first voltage controlled current generator (101), and at the other end to a supply voltage terminal (V+);
a first capacitor (C1), coupled at one end to a position between the first output circuit (401) of the first voltage controlled current generator (101) and the first resistor (R1) and at the other end to the second high impedance input circuit (500) of the second voltage controlled current generator (102);
a second resistor (R2), coupled at one end to the second output circuit (402) of the first voltage controlled current generator (101), and the other end to a common terminal (190); and
a second capacitor (C2) coupled at one end to a position between the second output circuit (402) of the first voltage controlled current generator (101) and the second resistor (R2) and at the other end to the third high impedance input circuit (600) of the third voltage controlled current generator (103).

3. A differential microphone pre-amplifier circuit (120), comprising:
a phase shifting circuit (130) configured to create a differential signal by phase shifting the received voltage signal from a connectable microphone (110) by 180 degrees,
a voltage controlled current generator (102) configured to be controlled by the 180 degrees phase shifted differential signal, and connected to a first output terminal (A), wherein the voltage controlled current generator (102) is configured to provide the amplified and converted differential current signal having a 180 degrees phase shift at the first output terminal (A),
a further voltage controlled current generator (103) configured to be controlled by an un-shifted differential signal, and connected to a second output terminal (B), wherein the further voltage controlled current generator 103 is configured to provide the amplified and converted differential current signal, having an un-shifted phase at the second output terminal (B).

4. A differential microphone pre-amplifier circuit (120) according to claim 3, comprising:
- a first voltage controlled current generator (101), configured to receive, amplify and convert the voltage signal generated by the connectable microphone (110) to a current signal output, wherein the first voltage controlled current generator (101) comprises
  - a first high impedance input circuit (400) operatively coupled to the connectable microphone (101),
  - a first output circuit (401); operatively coupled to a high impedance input circuit (500) of the voltage controlled current generator (102) via the phase shifting circuit (130); and
  - a second output circuit (402), operatively coupled to a further high impedance input circuit (600) of the further voltage controlled current generator (103) via the phase shifting circuit (130).

5. A differential microphone pre-amplifier circuit (120) according to claim 4, wherein the phase shifting circuit (130) comprises:
- a first resistor (R1), coupled at a first end to the first output circuit (401) of the first voltage controlled current generator (101), and at a second other end to a supply voltage terminal (V+);
- a first capacitor (C1), coupled at a first end to a position between the first output circuit (401) of the first voltage controlled current generator (101) and the first resistor (R1) and at a second end to the second high impedance input circuit (500) of the voltage controlled current generator (102);
- a second resistor (R2), coupled at a first end to the second output circuit (402) of the first voltage controlled current generator (101), and a second end to a common terminal (190); and
- a second capacitor (C2) coupled at a first end to a position between the second output circuit (402) of the first voltage controlled current generator (101) and the second resistor (R2) and at a second end to the further high impedance input circuit (600) of the further voltage controlled current generator (103).

* * * * *